United States Patent
Mizunuma et al.

(10) Patent No.: US 9,998,196 B2
(45) Date of Patent: Jun. 12, 2018

(54) ANTENNA DEVICE AND HIGH-FREQUENCY TRANSMITTER

(71) Applicant: DENSO CORPORATION, Kariya, Aichi-pref. (JP)

(72) Inventors: Koutarou Mizunuma, Kariya (JP); Yuu Watanabe, Kariya (JP); Yasushi Kouno, Kariya (JP); Eiichi Okuno, Kariya (JP); Takuya Fuse, Kariya (JP); Hirokazu Ohyabu, Kariya (JP)

(73) Assignee: DENSO CORPORATION, Kariya (JP)

( * ) Notice: Subject to any disclaimer, the term of this patent is extended or adjusted under 35 U.S.C. 154(b) by 0 days. days.

(21) Appl. No.: 15/538,713

(22) PCT Filed: Dec. 22, 2015

(86) PCT No.: PCT/JP2015/006404
§ 371 (c)(1),
(2) Date: Jun. 22, 2017

(87) PCT Pub. No.: WO2016/103688
PCT Pub. Date: Jun. 30, 2016

(65) Prior Publication Data
US 2017/0353225 A1 Dec. 7, 2017

(30) Foreign Application Priority Data

Dec. 25, 2014 (JP) .................................. 2014-263149
Dec. 25, 2014 (JP) .................................. 2014-263150

(51) Int. Cl.
*H01Q 11/12* (2006.01)
*H04B 1/04* (2006.01)
(Continued)

(52) U.S. Cl.
CPC ............. *H04B 7/0682* (2013.01); *H01Q 3/34* (2013.01); *H01Q 13/00* (2013.01); *H01Q 21/22* (2013.01); *H04B 1/04* (2013.01); *H04B 2001/045* (2013.01)

(58) Field of Classification Search
CPC .................... H04B 2001/0491; H04B 7/0682; H04B 1/04; H04B 2001/045; H04Q 3/34;
(Continued)

(56) References Cited

U.S. PATENT DOCUMENTS 5,901,345 A * 5/1999 Ikeda ....................... H03F 3/604
330/295
6,999,524 B1 * 2/2006 Boegl .................. H03G 3/3042
375/297

(Continued)

FOREIGN PATENT DOCUMENTS

JP 2000-111636 A 4/2000
JP 2004-296469 A 10/2004
(Continued)

OTHER PUBLICATIONS

Hiroki Maehara et al., "High Q factor over 3000 due to out-of-plane precession in nano-contact spin-torque oscillator based on magnetic tunnel junctions." Applied Physics Express 7., 023003. Jan. 10, 2014.
(Continued)

*Primary Examiner* — Nhan Le
(74) *Attorney, Agent, or Firm* — Posz Law Group, PLC

(57) ABSTRACT

An antenna device includes: antennas; magnetic oscillation element units converting electrical energy to high-frequency power; and a modulator outputting electrical energy input from outside to at least two magnetic oscillation element units, with a time difference to differentiate phases of high-frequency power converted from electrical energy by at least two magnetic oscillation element units. The magnetic
(Continued)

oscillation element units respectively include a pair of electrodes, and further include, between the pair of electrodes, a PIN layer, a free layer, and an intermediate layer. A resistance value of an element configured by the PIN, free and intermediate layers changes according to the angle between the magnetization direction of the PIN layer and the magnetization direction of the free layer. The antennas transmit electromagnetic waves to open space outside the magnetic oscillation element units with the supply of high-frequency power.

4 Claims, 11 Drawing Sheets

(51) Int. Cl.
*H04B 7/06* (2006.01)
*H01Q 3/34* (2006.01)
*H01Q 13/00* (2006.01)
*H01Q 21/22* (2006.01)

(58) Field of Classification Search
CPC .......... H04Q 13/00; H04Q 21/22; H03B 7/00; H03D 7/1441
USPC ................................ 455/101, 118, 333, 550
See application file for complete search history.

(56) References Cited

U.S. PATENT DOCUMENTS

| | | | | |
|---|---|---|---|---|
| 9,509,179 | B2* | 11/2016 | Chernokalov | H02J 17/00 |
| 2001/0034214 | A1* | 10/2001 | Koike | H04B 1/04 |
| | | | | 455/95 |
| 2007/0109147 | A1 | 5/2007 | Fukuzawa et al. | |
| 2008/0129401 | A1 | 6/2008 | Fukuzawa et al. | |
| 2008/0150643 | A1 | 6/2008 | Suzuki et al. | |
| 2008/0299904 | A1 | 12/2008 | Yi et al. | |
| 2010/0297475 | A1 | 11/2010 | Kawakami et al. | |
| 2011/0084880 | A1 | 4/2011 | Sakai et al. | |
| 2013/0222092 | A1 | 8/2013 | Nakada et al. | |
| 2014/0218122 | A1 | 8/2014 | Locatelli et al. | |
| 2014/0315498 | A1 | 10/2014 | Suzuki et al. | |
| 2015/0207062 | A1 | 7/2015 | Kawakami et al. | |
| 2015/0303931 | A1 | 10/2015 | Park et al. | |

FOREIGN PATENT DOCUMENTS

| | | |
|---|---|---|
| JP | 2010-147673 A | 7/2010 |
| JP | 2014-132263 A | 7/2014 |
| JP | 2014-212431 A | 11/2014 |
| JP | 2015-061286 A | 3/2015 |
| JP | 2015-061287 A | 3/2015 |

OTHER PUBLICATIONS

Hitoshi Kubota et al., "Spin-Torque Oscillator Based on Magnetic Tunnel Junction with a Perpendicularly Magnetized Free Layer and In-Plane Magnetized Polarizer." Applied Physics Express 6., 103003. Sep. 27, 2013.

* cited by examiner

ANTENNA DEVICE AND HIGH-FREQUENCY TRANSMITTER

CROSS REFERENCE TO RELATED APPLICATIONS

This application is a U.S. national stage of International Patent Application No. PCT/JP2015/006404 filed on Dec. 22, 2015 and is based on Japanese Patent Application No. 2014-263149 filed on Dec. 25, 2014 and Japanese Patent Application No. 2014-263150 filed on Dec. 25, 2014, the disclosures of which are incorporated herein by reference.

TECHNICAL FIELD

The present disclosure relates to an antenna device that transmits electromagnetic waves to an arbitrary direction, and to a high-frequency transmitter that transmits high-frequency electromagnetic waves.

BACKGROUND ART

Antenna devices that transmit electromagnetic waves to an arbitrary direction by some methods such as providing a plurality of antennas have hitherto been utilized.

The phased-array radar device shown in Patent Literature 1, for example, changes the overall directivity of the electromagnetic waves transmitted from antennas by changing the phases of electromagnetic waves emitted from the antennas, with a transmitter module that includes an amplifier and a high-frequency phase shifter connected to each of the antennas.

However, high-precision high-frequency phase shifters are generally large and expensive. Accordingly, an antenna device that uses a transmitter module having such a high-frequency phase shifter and is capable of precisely controlling the overall directivity of electromagnetic waves transmitted from the antennas is large as well as expensive.

A wireless communication system shown, for example, in Patent Literature 1 has hitherto been proposed as a high-frequency transmitter. Such a wireless communication system includes a converter that converts electrical energy to high-frequency power, a high-frequency power transmission means that sends the converted high-frequency power to a transmitter, and the transmitter that converts the high-frequency power sent thereto to an electromagnetic wave and transmits the converted electromagnetic wave to the outside. The high-frequency electromagnetic wave is an electromagnetic wave of 10 GHz or more, for example. The high-frequency power transmission means is a waveguide, for example. The transmitter is an antenna, for example. In the wireless communication system shown in Patent Literature 1, a transceiver device corresponds to the converter, an RF coaxial cable corresponds to the high-frequency power transmission means, and an antenna corresponds to the transmitter.

With this configuration, electrical energy supplied from a power supply is converted to high-frequency power by the converter. The high-frequency power is sent to the transmitter by the high-frequency power transmission means, and converted into an electromagnetic wave and transmitted to the outside by the transmitter, whereby communication among a plurality of devices spaced away from each other is made possible.

The converter commonly requires parts such as capacitors, coils, quartz oscillators, and semiconductor elements. These parts are mounted on a circuit board and turned into a board unit to be installed. When designed as a board unit, the converter has less space for installing antennas, so that the converter and antennas are commonly spaced away from each other. This is why the high-frequency power transmission means is required for transmission between the converter and the antennas that are spaced away from each other, so that a waveguide or the like is used.

However, transmission of high-frequency power by a high-frequency power transmission means such as an RF coaxial cable and waveguide as in the wireless communication system shown in Patent Literature 1 noted above significantly attenuates the high-frequency power, which reduces the overall efficiency of the system.

PRIOR ART LITERATURES

Patent Literature

Patent Literature 1: JP 2010-147673 A
Patent Literature 2: JP 2014-132263 A

SUMMARY OF INVENTION

It is an object of the present disclosure to provide an antenna device that can be made smaller by avoiding usage of a high-frequency circuit such as a high-frequency phase shifter for the adjustment of the phase of electromagnetic wave transmitted from each antenna, and a high-frequency transmitter that enables an increase in the overall efficiency of the system by avoiding transmission of high-frequency power.

An antenna device according to one aspect of the present disclosure includes: a plurality of antennas; a plurality of magnetic oscillation element units that respectively include at least one magnetic oscillation element, which converts electrical energy to high-frequency power; and a modulator that outputs electrical energy, which is input from outside to at least two of the plurality of magnetic oscillation element units, with a time difference to differentiate phases of high-frequency power converted from electrical energy by the at least two magnetic oscillation element units from each other. In addition, the plurality of magnetic oscillation element units respectively include a pair of electrodes in a thin-film form, and have, between the pair of electrodes, a PIN layer having a fixed magnetization direction, a free layer having a magnetization direction varied in accordance with an external magnetic field, and an intermediate layer disposed between the PIN layer and the free layer. Moreover, a resistance value of an element, which is configured by the PIN layer, the intermediate layer and the free layer, changes depending on an angle between the magnetization direction of the PIN layer and the magnetization direction of the free layer. Furthermore, the plurality of antennas are respectively supplied with high-frequency power converted from electrical energy by corresponding one of the plurality of magnetic oscillation element units so as to transmit electromagnetic waves to open space outside the plurality of magnetic oscillation element units correspondingly.

With this configuration, electrical energy is converted to high-frequency power by a plurality of magnetic oscillation element units, and the phase of the high-frequency power converted by each magnetic oscillation element unit can be changed by a modulator means. This makes it possible to transmit electromagnetic waves with different phases from the antennas without using a high-frequency circuit such as a high-frequency phase shifter for the adjustment of the phases between the elements, so that the direction of the electromagnetic waves transmitted from the entire antenna device can be controlled. Thus, the antenna device can be made small as well as inexpensive, by avoiding usage of a high-frequency circuit such as a high-frequency phase shifter for the adjustment of the phases between the elements.

An antenna device according to a second aspect of the present disclosure includes: a plurality of antennas; and a plurality of magnetic oscillation element units that respectively include at least one magnetic oscillation element, which converts electrical energy to high-frequency power. In addition, the plurality of magnetic oscillation element units respectively include: a pair of electrodes in a thin-film form, and have, between the pair of electrodes, a PIN layer having a fixed magnetization direction; a free layer having a magnetization direction varied in accordance with an external magnetic field; and an intermediate layer disposed between the PIN layer and the free layer. Moreover, a resistance value of an element, which is configured by the PIN layer, the intermediate layer, and the free layer, changes depending on an angle between the magnetization direction of the PIN layer and the magnetization direction of the free layer. Furthermore, the plurality of antennas are respectively supplied with high-frequency power converted from electrical energy by corresponding one of the plurality of magnetic oscillation element units so as to transmit electromagnetic waves to open space outside the plurality of magnetic oscillation element units correspondingly; and at least two of the plurality of antennas are disposed in different orientations.

With this configuration, by orienting at least two antennas in different directions, and supplying the high-frequency power converted from electrical energy by the magnetic oscillation element units to the antennas, each of the antennas can transmit an electromagnetic wave in different directions. This makes it possible to transmit an electromagnetic wave to an arbitrary direction without using a high-frequency phase shifter, and thus the antenna device can be made small as well as inexpensive, by avoiding usage of a high-frequency circuit such as a high-frequency phase shifter for the adjustment of the phases between the elements.

A high-frequency transmitter according to a third aspect of the present disclosure includes: a converter that converts electrical energy to high-frequency power; and a transmitter unit that transmits high-frequency power converted by the converter to a space outside the converter as an electromagnetic wave. In addition, the converter includes a magnetic oscillation element having a function of modulating the high-frequency power in accordance with the electrical energy. Moreover, the magnetic oscillation element includes: a pair of electrodes in a thin-film form, and having, between the pair of electrodes; a PIN layer having a fixed magnetization direction; a free layer having a magnetization direction varied in accordance with an external magnetic field; and an intermediate layer disposed between the PIN layer and the free layer. Furthermore, a resistance value of an element, which is configured by the PIN layer, the intermediate layer, and the free layer, changes depending on an angle between a magnetization direction of the PIN layer and a magnetization direction of the free layer; and the transmitter unit is configured integrally with the magnetic oscillation element.

With this configuration, since the magnetic oscillation element and the transmitter are configured in one piece, no high-frequency power transmission means such as a waveguide is necessary. As attenuation of high-frequency power is minimized, the efficiency of the entire system is improved.

BRIEF DESCRIPTION OF DRAWINGS

The above and other objects, features and advantages of the present disclosure will become more apparent from the following detailed description made with reference to the accompanying drawings. In the drawings.

EMBODIMENTS FOR CARRYING OUT INVENTION

Figure 1:
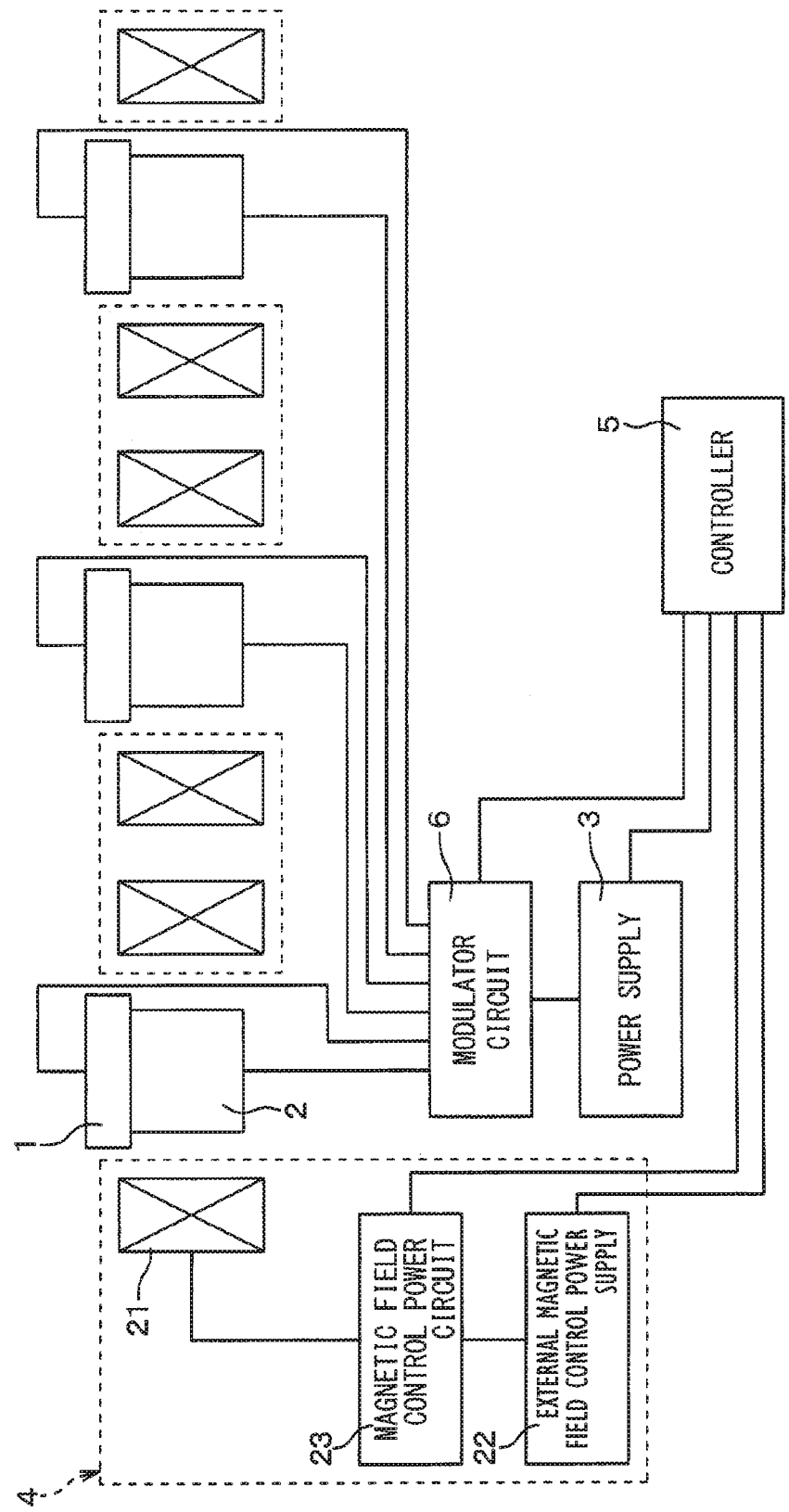
FIG. 1 is an overall configuration diagram illustrating a transmitter system to which an antenna device is applied, or of a high-frequency transmitter, according to a first embodiment.

Hereinafter, embodiments of the present disclosure will be described with reference to the drawings. In the following description of various embodiments, parts that are identical or equivalent to each other are given the same reference numerals.

(First Embodiment)

A first embodiment of the present disclosure will be described. Here, a transmitter system that has an antenna device (or high-frequency transmitter) to which a first embodiment of the present disclosure is applied will be described as one example. The antenna device (or high-frequency transmitter) described in the present embodiment is mounted on a car, for example, and used for vehicle-to-vehicle or road-to-vehicle communications, but the antenna device (or high-frequency transmitter) can be used for other than cars, such as for mobile phones and other information communication equipment. The antenna device (or high-frequency transmitter) can also be used for milliwave radars. A milliwave radar is used for measuring the distance and speed of a car relative to a preceding car for carrying out adaptive cruise control (ACC), for example.

The antenna device or high-frequency transmitter, according to the present embodiment will now be described below with reference to FIG. 1 to FIG. 4. First, the overall configuration of the transmitter system according to the present embodiment will be described with reference to FIG. 1.

The transmitter system includes an antenna device (or a high-frequency transmitter including antennas 1 and magnetic oscillation elements), a power supply 3, an external magnetic field application unit 4, and a controller 5. The antenna device includes a plurality of antennas 1, a plurality of magnetic oscillation element units 2, and a modulator circuit 6. Each magnetic oscillation element unit 2 includes a magnetic oscillation element. The modulator circuit 6 corresponds to a modulator of the present disclosure. The external magnetic field application unit 4 may be integrated with the magnetic oscillation elements in some cases as will be described later.

The antennas 1 are a part that transmits high-frequency electromagnetic waves to outside when high-frequency power is supplied. The high-frequency electromagnetic wave here means an electromagnetic wave of 10 GHz or more, for example. In the present embodiment, each antenna 1 serves also as wiring that connects the antenna 1 and the magnetic oscillation element provided in the magnetic oscillation element unit 2 to the modulator circuit 6 (or wiring that connects the high-frequency transmitter to the power supply 3).

The magnetic oscillation element units 2 are a part that converts the supplied direct current and voltage to high-frequency power and includes at least one magnetic oscillation element configured by a plurality of layered films. In the present embodiment, each magnetic oscillation element unit 2 includes a plurality of magnetic oscillation elements. In the magnetic oscillation element unit 2, the magnetic oscillation elements are connected in parallel with each other to the modulator circuit 6. The magnetic oscillation element will be described in detail later.

The power supply 3 is a device that supplies direct current and voltage to the antennas 1 and the magnetic oscillation elements provided in the magnetic oscillation element units 2 via the modulator circuit 6. In other words, the power supply 3 is a device that supplies direct current and voltage to the antennas 1 and the magnetic oscillation elements. The frequency of the high-frequency power generated by the magnetic oscillation elements provided in the magnetic oscillation element units 2 varies depending on the magnitude of the direct current and voltage supplied from this power supply 3. For example, if the power supply 3 is a constant voltage source, the frequency of the high-frequency current generated by changes in resistance of the magnetic oscillation elements as will be described later varies depending on the magnitude of the voltage supplied by the power supply 3. If the power supply 3 is a constant current source, the frequency of the high-frequency voltage generated by changes in resistance of the magnetic oscillation elements varies depending on the magnitude of the current supplied by the power supply 3. The antennas 1 and the magnetic oscillation element units 2 are each separately connected to the modulator circuit 6 and driven discretely by the modulator circuit 6.

The external magnetic field application unit 4 is a part that applies an external magnetic field to the magnetic oscillation elements provided in the magnetic oscillation element units 2 to change the frequency of the high-frequency power generated by the magnetic oscillation elements provided in the magnetic oscillation element units 2.

The external magnetic field application unit 4 is configured to include an external magnetic field generator 21, an external magnetic field control power supply 22, and a magnetic field control power circuit 23. The external magnetic field generator 21 is coils here, and is a part that generates a magnetic field when a current is conducted from the external magnetic field control power supply 22 via the magnetic field control power circuit 23 and that applies the magnetic field to the magnetic oscillation elements provided in the magnetic oscillation element units 2. Alternatively, the external magnetic field application unit 4 is configured to include an external magnetic field generator 21 and an external magnetic field control power supply 22. The external magnetic field generator 21 is coils here, and is a part that generates a magnetic field when a current is conducted from the external magnetic field control power supply 22 and that applies the magnetic field to the magnetic oscillation element units 2.

In the present embodiment, two coils are disposed in each magnetic oscillation element unit 2. The two coils are disposed on both sides in one in-plane direction of the plurality of films that configure the magnetic oscillation elements in the magnetic oscillation element unit 2 to apply an external magnetic field in a direction perpendicular to the film plane. More specifically, the two coils have their axes oriented along the direction perpendicular to the film plane, and the current from the external magnetic field control power supply 22 and magnetic field control power circuit 23 (or the current from the external magnetic field control power supply 22) flows through the wires that form the two coils in the same direction as viewed from the axial direction of the coils. This generates magnetic fields that pass through the two coils provided with respect to one magnetic oscillation element unit 2 in the same direction, and through the magnetic oscillation elements in the direction perpendicular to the film plane. These magnetic fields are combined to generate a magnetic field that passes through the magnetic oscillation elements provided in the magnetic oscillation element unit 2 placed between the two coils in the direction perpendicular to the film plane.

Optionally, magnetic fields may be applied in in-plane directions of the magnetic oscillation elements. In this case, for example, the coils disposed as described above are arranged such that their axes are oriented along one in-plane direction, and the current is conducted from the external magnetic field control power supply 22 and magnetic field control power circuit 23 (or the current from the external magnetic field control power supply 22) to the wires that configure the two coils so as to flow in the same direction as viewed from the axial direction of the coils. This generates magnetic fields that pass through the coils in the same direction, and these magnetic fields are combined to generate a magnetic field that passes through the magnetic oscillation elements placed between the two coils in one in-plane direction.

Alternatively, the coils may be disposed on one side or both sides in the direction perpendicular to the film plane of the magnetic oscillation elements, and with the coil axes being oriented along the direction perpendicular to the film plane, the current from the external magnetic field control power supply 22 and magnetic field control power circuit 23 (or the current from the external magnetic field control power supply 22) may be conducted, to apply magnetic fields to the magnetic oscillation elements in the direction perpendicular to the film plane.

The magnetic field control power circuit 23 is disposed between the external magnetic field generator 21 and the external magnetic field control power supply 22, and adjusts the current from the external magnetic field control power supply 22 to adjust the magnitude of the external magnetic field applied to the magnetic oscillation elements provided in the magnetic oscillation element units 2.

The controller 5 is a part that controls the power supply 3, modulator circuit 6, external magnetic field control power supply 22, and magnetic field control power circuit 23 in accordance with the situation, or a part that controls the power supply 3 and external magnetic field control power supply 22, and is configured with a known microcomputer made up of a CPU, ROM, RAM, etc., and its peripheral circuits. The controller 5 is connected to the power supply 3, modulator circuit 6, external magnetic field control power supply 22, and magnetic field control power circuit 23. Alternatively, the controller 5 may be connected to the power supply 3 and external magnetic field control power supply 22 in some cases.

Figure 2A:
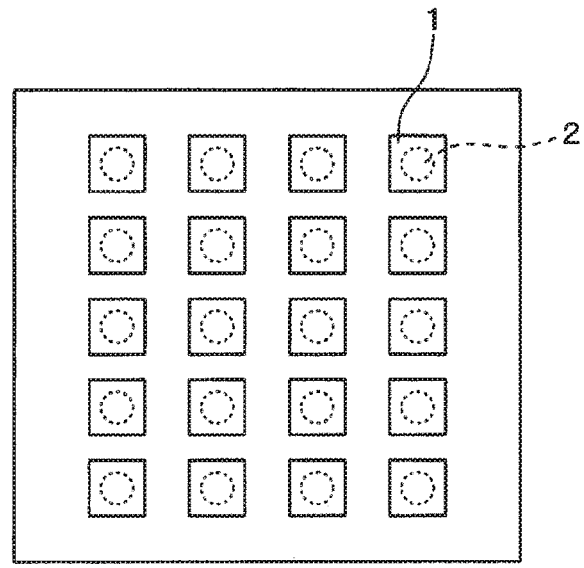
FIG. 2A is a plan view illustrating the antenna device according to the first embodiment.
Figure 2B:
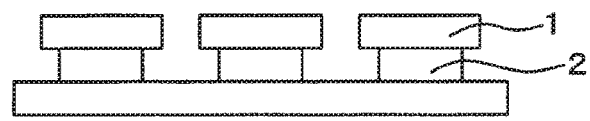
FIG. 2B is a cross-sectional view illustrating the antenna device according to the first embodiment.

Next, the arrangement of the antennas 1 and magnetic oscillation element units 2 will be described with reference to FIG. 2A and FIG. 2B.

The antenna device includes a plurality of antennas 1 and a plurality of magnetic oscillation element units 2. As illustrated in FIG. 2A, one magnetic oscillation element unit 2 is disposed for one antenna 1. In the present embodiment, as illustrated in FIG. 2A and FIG. 2B, the plurality of antennas 1 are oriented in the same direction and arranged in grids.

Insulating layers made of Al—$O_x$, MgO, $SiO_2$ and the like are configured between the plurality of magnetic oscillation elements in each magnetic oscillation element unit 2, so that the plurality of magnetic oscillation elements are insulated from each other in the in-plane directions.

Next, a magnetic oscillation element of each magnetic oscillation element unit 2 will be described in detail with reference to FIG. 3.

The magnetic oscillation element is configured with a lower electrode 11, a base layer 12, an antiferromagnetic layer 13, a PIN layer 14, an intermediate layer 15, a free layer 16, a cap layer 17, and an upper electrode 18 stacked on a substrate 10 in order. Of these, the lower electrode 11 and upper electrode 18 correspond to the pair of electrodes of the present disclosure. In the up-and-down direction in FIG. 3, the layers are arranged downward from the substrate 10.

In the present embodiment, the substrate 10 is a conductive substrate and made of Cu, Au, and the like, for example. A Ta layer (not illustrated) is configured on the substrate 10. The Ta layer is formed on the substrate 10 for providing wettability with the substrate and for the orientability of the layers from the lower electrode 11 onward. The lower electrode 11 is made of a conductive material such as Ru, Cu, CuN, and Au, and formed on the Ta layer (not illustrated) in a thin film.

The base layer 12 is made of Ta, Ru, and the like and formed on the lower electrode 11 in a thin film. The base layer 12 improves the crystallinity and orientability, and serves as a base for forming the antiferromagnetic layer 13.

The antiferromagnetic layer 13 is made of IrMn, PtMn, and the like, and formed on the base layer 12 in a thin film. The antiferromagnetic layer 13 is provided for fixing the magnetization direction of the PIN layer 14 by exchange coupling.

The PIN layer 14 is made of a ferromagnetic material such as Co, Fe, and Ni, or a ferromagnetic material and B, and formed on the antiferromagnetic layer 13 in a thin film. The magnetization direction of the PIN layer 14 is fixed in an in-plane direction here by exchange coupling with the antiferromagnetic layer 13. The PIN layer 14 may also be formed by using Pt and Pd in addition to the materials noted above. Alternatively, the PIN layer 14 may be made from a high magnetic anisotropic material such as GaMn, FePt (Pd), and CoPt (Pd, Ni).

Although not illustrated, a magnetic layer made of NiFe or the like is formed between the base layer 12 and the antiferromagnetic layer 13. Magnetic layer made of CoFe or the like, and a layer which is made of Ru or the like and which fixes the magnetization direction of the magnetic layer formed in the up-and-down direction by the RKKY interaction are formed between the antiferromagnetic layer 13 and the PIN layer 14.

That is, when the antiferromagnetic layer 13 is made of IrMn and the PIN layer 14 is made of CoFeB, the layers sandwiched between the base layer 12 and the Intermediate layer 15 have a configuration in which NiFe/IrMn/CoFe/Ru/CoFeB and the like are laminated in order from the base layer 12.

The magnetic oscillation element of the present embodiment includes a synthetic ferrimagnetic layer configured by a plurality of magnetic layers with the use of the RKKY interaction of Ru or the like. In a configuration in which a synthetic ferrimagnetic layer is used, the influences of leaking magnetic fields from the two magnetic layers on the free layer 16 can be reduced by setting the directions of magnetization of the two magnetic layers sandwiching Ru thereon and thereunder opposite from each other.

The intermediate layer 15 is made of MgO, Al—$O_x$, Cu, Ag, and the like, and is formed on the PIN layer 14 in a thin film. The resistance value of the element configured by the PIN layer 14, intermediate layer 15, and free layer 16 changes depending on the angle made between the magnetization direction of the PIN layer 14 and the magnetization direction of the free layer 16. When the intermediate layer 15 is made of an insulating material such as MgO and Al—$O_x$, a TMR (Tunneling Magnetoresistance) element is configured by the lamination of the PIN layer 14, intermediate layer 15, and free layer 16. When the intermediate layer 15 is made of a conductive material such as Cu and Ag, a GMR (Giant Magnetoresistance) element is configured by the lamination of the PIN layer 14, intermediate layer 15, and free layer 16. While the intermediate layer 15 is described as being configured by an insulating material or a conductive material here, the intermediate layer 15 may also be configured by a semiconductor.

The free layer 16 is made of a ferromagnetic material such as Co, Fe, and Ni, or a ferromagnetic material and B, and formed on the intermediate layer 15 in a thin film. The magnetization direction of the free layer 16 is changed by an external magnetic field generated by the external magnetic field application unit 4. The free layer 16 may also be configured by using Pt and Pd in addition to the materials noted above. Alternatively, the free layer 16 may be made from a high magnetic anisotropic material such as GaMn, FePt (Pd), CoPt (Pd, Ni). Also, the free layer 16 may have a laminated configuration such as CoFeB/GaMn and CoFeB/FePt. Alternatively, the free layer 16 may have a laminated configuration such as CoFeB/Ta/GaMn.

The cap layer 17 is made of Ta, Ru and the like and formed on the free layer 16 in a thin film. The cap layer 17 is provided for protecting the free layer 16 during the processing. When CoFeB or the like is used for the free layer 16 as will be described later, the cap layer also serves as an absorption layer for diffusing B in CoFeB.

The upper electrode 18 is made of a conductive material such as Au, Cu, CuN, and Ru, and formed on the cap layer 17 in a thin film. Such a magnetic oscillation element can be produced by forming the films on the substrate 10 in order.

When CoFeB is used for the PIN layer 14 and free layer 16, first, a CoFeB film is formed so as to be in an amorphous state. Because of B, the film takes on an amorphous form without any procedure. Then, MgO is formed with (001) orientation on this amorphous CoFeB. Then, CoFeB is formed in an amorphous state on the film to form the cap layer 17. Thereafter, through a heat treatment at 300° C. to 350° C., B in CoFeB diffuses into the MgO layer, cap layer 17, or base layer 12, and crystallizes from the amorphous state in a body-centered-cubic (bcc) structure with (001) orientation. This crystallization of CoFeB/MgO/CoFeB leads to a high MR ratio (magnetoresistance ratio), i.e., higher output of high-frequency electromagnetic waves.

In the present embodiment, the antenna 1 and magnetic oscillation element are united. More specifically, as illustrated in FIG. 3, the magnetic oscillation element is connected to the antenna 1 with the upper electrode 18 in contact with the antenna 1, by being covered with an insulating resin 19. When the magnetic oscillation element and the antenna 1 are produced separately, the substrate 10 is necessary under the lower electrode 11 during the production process. Since the upper electrode 18 has a thickness of several tens nm to several hundreds nm, while the substrate commonly has a thickness of several hundreds μm, the upper electrode 18 and antenna 1 are connected together in the present embodiment in order to minimize the distance between the oscillation unit and the antenna 1. Optionally, the substrate 10 and the antenna 1 may be connected together to prevent any gap from being created between the antenna 1 and the magnetic oscillation element, because the substrate 10 can make tight contact with the antenna 1 easily compared to the upper electrode 18.

In this case, it is desirable to join the magnetic oscillation element and the antenna 1 together so that no insulating resin 19 will flow in between them because if it does, the resistance between the antenna 1 and the magnetic oscillation element will increase.

When the magnetic oscillation element 2 and the antenna 1 are produced separately, the substrate 10 is necessary under the lower electrode 11 during the production process. Since the upper electrode 18 has a thickness of several tens nm to several hundreds nm, while the substrate commonly has a thickness of several hundreds μm, the upper electrode 18 and antenna 1 are connected together in the present embodiment in order to minimize the distance between the oscillation unit and the antenna 1. Optionally, the substrate 10 and the antenna 1 may be connected together to prevent any gap from being created between the antenna 1 and the magnetic oscillation element 2, because the substrate 10 can make tight contact with the antenna 1 easily compared to the upper electrode 18.

Figure 3:
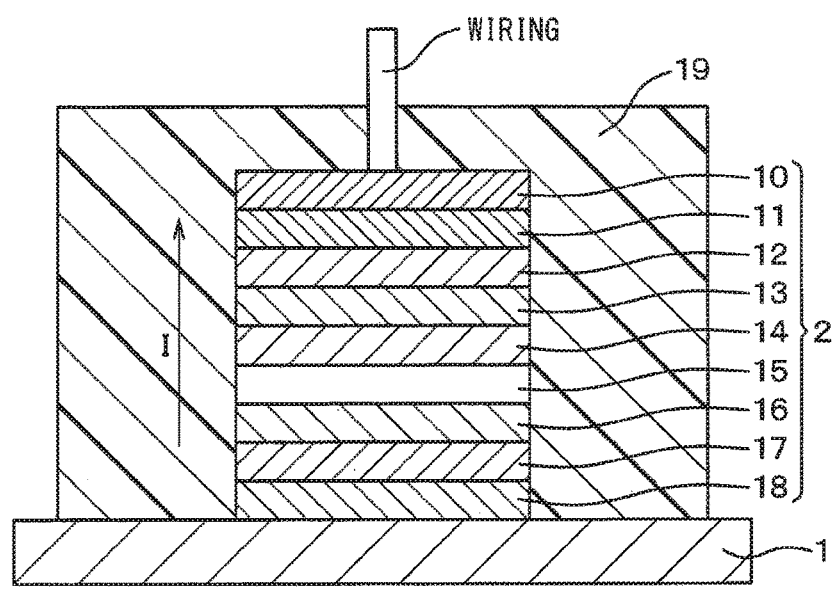
FIG. 3 is a cross-sectional view illustrating the antenna device, or the high-frequency transmitter, according to the first embodiment.

As illustrated in FIG. 3, the magnetic oscillation element 2 can be connected to the antenna 1 with the upper electrode 18 in contact with the antenna 1, by being covered with insulating resin 19. In this case, it is desirable to join the magnetic oscillation element 2 and the antenna 1 together so that no insulating resin 19 will flow in between them because if it does, the resistance of the high-frequency transmitter will increase.

The antenna 1 and the upper electrode 18 may be connected together with In, solder, and the like. While this will increase the distance between the antenna 1 and the magnetic oscillation element, it can prevent any gap from being created between the antenna 1 and the upper electrode 18. Alternatively, the antenna 1 and the upper electrode 18 may be connected together by press-bonding.

If the magnetic oscillation element and the antenna 1 are connected together before providing the wiring on the substrate 10, a hole may be drilled in the Insulating resin 19 for electrical conduction and a wire may be passed through the hole, so that the antenna 1 and the magnetic oscillation element can be connected to the modulator circuit 6 as illustrated in FIG. 1.

The operation of the transmitter system according to the present embodiment will now be described with reference to FIG. 1 to FIG. 4.

First, a signal is sent from the controller 5 to the power supply 3 to generate a DC voltage at both ends of the antennas 1 and magnetic oscillation element units 2 by the power supply 3 and modulator circuit 6 (or the power supply 3 alone), so that a direct current I flows from the power supply 3 via the modulator circuit 6 to each antenna 1 and each magnetic oscillation element in the magnetic oscillation element unit 2. In some cases, the direct current I may be conducted from the power supply 3 to the antennas 1 and magnetic oscillation elements. The direct current I flows in the direction from the free layer 16 to the PIN layer 14. Electrons thus move from the PIN layer 14 to the free layer 16. An external magnetic field is applied by the external magnetic field application unit 4 to the magnetic oscillation elements in a direction parallel to, or inclined some degrees from, the magnetization direction of the free layer 16. Here, the external magnetic field is applied in a direction perpendicular to the film plane.

The spin torque of electrons then causes magnetization precession of the free layer 16. The magnetization is not reversed here, since the external magnetic field is applied in a direction parallel to the magnetization direction of the free layer 16, i.e., in a direction in which the magnetization reversal driven by spin injection does not occur.

With the magnetization precession of the free layer 16, the resistance of the magnetic oscillation elements changes constantly due to the MR effect, so that high-frequency current and voltage are generated at both ends of the magnetic oscillation elements, thus generating high-frequency power. In other words, the direct current and voltage are converted into high-frequency power. The high-frequency power generated by the plurality of magnetic oscillation elements in the magnetic oscillation element units 2, and combined together, is transmitted as high-frequency electromagnetic waves through the antennas 1.

High-frequency electromagnetic waves are thus transmitted from each antenna 1 through the operation described above. The phase of the high-frequency electromagnetic wave can be changed in each antenna 1 by the operation of the modulator circuit 6 described below. The method of controlling the phase when using the modulator circuit 6 is completely different from the case when using a high-frequency circuit such as a high-frequency phase shifter.

A high-frequency circuit such as a high-frequency phase shifter performs the phase control after the electric energy has been converted to high-frequency power through the magnetic oscillation elements. Accordingly, an elaborate device is necessary for precise phase control.

In contrast, the modulator circuit 6 controls the phase before electrical energy is input to the magnetic oscillation elements, i.e., when electrical energy is in the form of a direct current, or with a low frequency. Therefore, the phase control with the use of the modulator circuit 6 is easier than that with the use of a high-frequency circuit such as a high-frequency phase shifter.

Figure 4A:
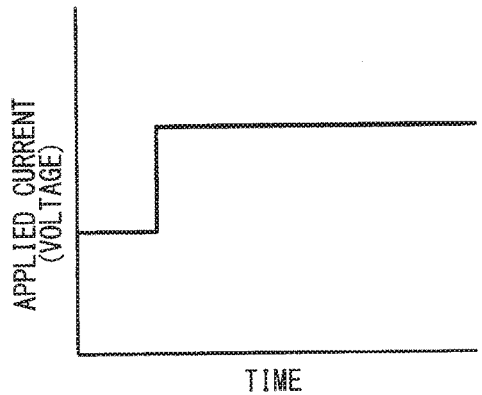
FIG. 4A is a graph illustrating an operation of a modulator circuit in the first embodiment.
Figure 4B:
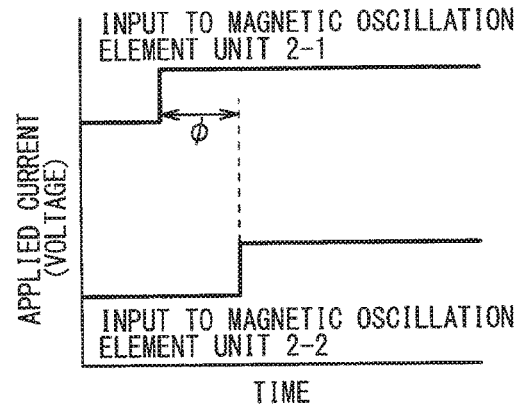
FIG. 4B is a graph illustrating an operation of the modulator circuit in the first embodiment.
Figure 4C:
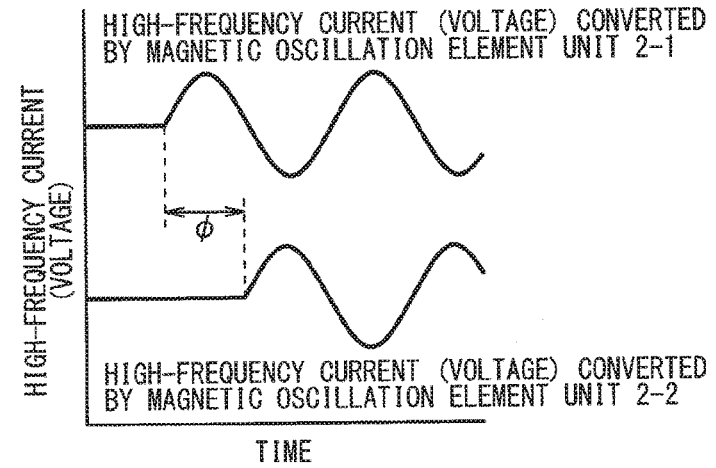
FIG. 4C is a graph illustrating an operation of the modulator circuit in the first embodiment.
Figure 4D:
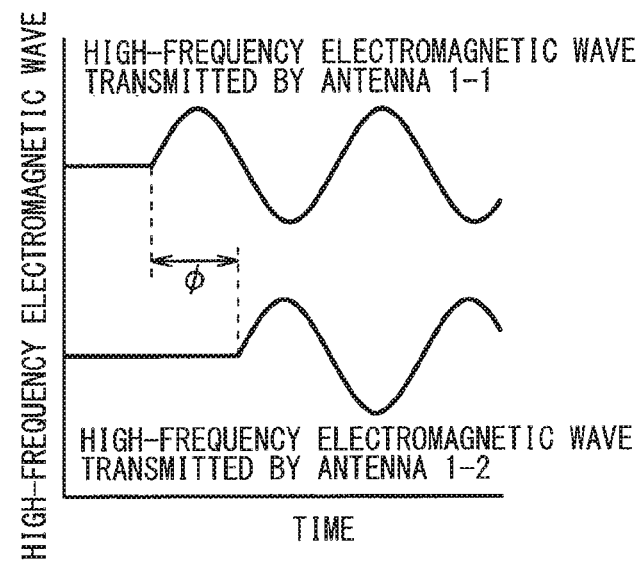
FIG. 4D is a graph illustrating an operation of the modulator circuit in the first embodiment.

More specifically, the modulator circuit 6 outputs the signal input from the power supply 3 illustrated in FIG. 4A to the magnetic oscillation elements of two of the magnetic oscillation element units 2 (denoted by 2-1, 2-2 in the drawing) by a time φ as illustrated in FIG. 4B. This creates a difference in phase by the time φ between the high-frequency power converted from direct current and voltage by the magnetic oscillation element in the magnetic oscillation element unit 2-1 and the high-frequency power converted from the direct current and voltage by the magnetic oscillation element in the magnetic oscillation element unit 2-2, as illustrated in FIG. 4C. This way, there is created a difference in phase by the time φ between the high-frequency electromagnetic waves transmitted from the two antennas (denoted by 1-1 and 1-2 in the drawing) corresponding to the magnetic oscillation element units 2-1 and 2-2, respectively as illustrated in FIG. 4D.

The phases of high-frequency electromagnetic waves can be controlled in this way by changing the timing of supplying electrical energy to the magnetic oscillation elements with the use of the modulator circuit 6. Such phase control is possible because a phase difference given to electrical energy in the form of a direct current or with a low frequency remains in the high-frequency power converted by the magnetic oscillation elements.

By thus providing a time difference in the signal outputs to the magnetic oscillation elements in the magnetic oscillation element units 2, the phases of the high-frequency electromagnetic waves transmitted from each antenna 1 can be changed, so that the direction of the high-frequency electromagnetic waves transmitted from the entire antenna device can be controlled. In other words, the transmitter system to which the antenna device of the present embodiment is applied can be used as a transmitter system of a phased-array antenna device.

Next, the effects of the present embodiment will be described.

To transmit electromagnetic waves to a certain direction with a conventional antenna device, a transmitter module that includes an amplifier and a high-frequency phase shifter is connected to each of a plurality of antennas. The phase of electromagnetic wave transmitted from each antenna needs to be changed in order to change the overall directivity of the electromagnetic waves transmitted from the antennas.

In contrast, the antenna device of the present embodiment uses magnetic oscillation elements as the device for converting direct current and voltage into high-frequency power. The phase of the alternating current converted by the magnetic oscillation element of each magnetic oscillation element unit 2 is changed discretely by the modulator circuit 6 as described above. Accordingly, a high-frequency signal can be output based on a DC signal or a low-frequency signal output from the modulator circuit 6 without using a high-frequency circuit such as a high-frequency phase shifter for the adjustment among the magnetic oscillation element units 2. This way, a transmitter system of a phased-array antenna device that transmits electromagnetic waves to a certain direction can be configured. Since a precise high-frequency phase shifter, which is expensive and bulky, is not necessary in the antenna device of the present embodiment, the antenna device of the present embodiment can be produced compactly as well as inexpensively.

In the antenna device that uses the transmitter module described above, the output signal of the transmitter module is attenuated by transmission through the high-frequency phase shifters. Amplifiers are provided in order to amplify the output signal that has been attenuated. A power supply is therefore required for driving the amplifiers, and another power supply is required for driving the high-frequency phase shifters. Also, circuits and the like are required for minimizing amplitude errors and phase errors between transmitter modules for the beam formation by the high-frequency phase shifters. This way, the use of high-frequency phase shifters consumes a lot of energy and reduces the efficiency of the entire system.

In contrast, in the antenna device of the present embodiment, there is no need to use high-frequency phase shifters, and therefore attenuation of output signals caused by the high-frequency phase shifters is avoided and the efficiency of the entire system can be improved. Since no power supplies are necessary for the high-frequency phase shifters or amplifiers, energy consumption associated with the use of the high-frequency phase shifters is avoided and the efficiency of the entire system can be improved. Although signals pass through the modulator circuit 6, electrical energy is not converted into high-frequency electromagnetic waves through the modulator circuit 6. Therefore, transmission through the modulator circuit 6 hardly causes attenuation of high-frequency electromagnetic wave signals or other influences.

The antennas 1 may be formed by joining a flat metal plate to a plurality of magnetic oscillation element units 2 and then cutting the flat metal plate into the shape of each antenna 1, or the antennas 1 may be produced separately before being connected to the magnetic oscillation element units 2. If cutting is performed on a flat metal plate after the flat metal plate has been connected to the magnetic oscillation element units 2, it is easy to align the heights of the plurality of antennas 1, which will facilitate the control of directions of high-frequency electromagnetic waves to be transmitted from the entire antenna device.

In the conventional antenna device, in order to convert electrical energy in DC form to AC, converters are configured with various parts such as coils, capacitors, quartz oscillators, and semiconductor elements, and installed as a board unit, with these parts mounted on a circuit board. When designed as a board unit, the converter has less space for installing antennas, so that the converter and antennas are commonly spaced away from each other. Waveguides and the like are used to transmit high-frequency power between the converters and the antennas spaced away from each other. With this configuration, the high-frequency power is significantly attenuated, and thus the efficiency of the entire system is lowered.

In contrast, the magnetic oscillation elements themselves in the antenna device of the present embodiment convert direct current and voltage into high-frequency power and serve as converters. The frequency of the high-frequency power generated by the magnetic oscillation elements varies depending on the magnitudes of the direct current and voltage, or the magnitudes and directions of external magnetic fields, so that, by changing these, the frequency of the high-frequency electromagnetic waves transmitted from the antennas 1 can be varied. Thus, converters configured by the magnetic oscillation element units 2 having a plurality of magnetic oscillation elements do not require a large number of parts for converting DC to AC, or for adjusting the frequency of the converted AC, and so the converters configured by the magnetic oscillation element units 2 can be readily bonded to and united with the antennas 1.

In the present embodiment, since the antennas 1 and magnetic oscillation element units 2 are united, there is no need to transmit high-frequency power with waveguides or the like as conventionally practiced. Therefore, attenuation caused by transmission of high-frequency power is minimized, and the efficiency of the entire system can be improved.

Moreover, the conventional antenna device uses high-frequency amplifiers to amplify the output when high power transmission of high-frequency electromagnetic waves is required, which leads to a longer high-frequency electromagnetic wave path, increased module size, and higher power consumption.

In contrast, in the antenna device of the present embodiment, the magnetic oscillation element units 2 are formed by a plurality of integrated magnetic oscillation elements to increase the output power of high-frequency electromagnetic waves. The joint area between the magnetic oscillation elements and the antennas 1 is as small as, for example, several nm to several μm, so that the magnetic oscillation elements and the antennas 1 can be integrated without causing an increase in the high-frequency electromagnetic wave path and module size. Also, since power consumption of magnetic oscillation elements is small, the efficiency of the entire system can be improved.

The substrate 10 is made of a conductive material in the present embodiment, but the substrate 10 may be made of an insulating material such as $SiO_2$.

Figure 5:
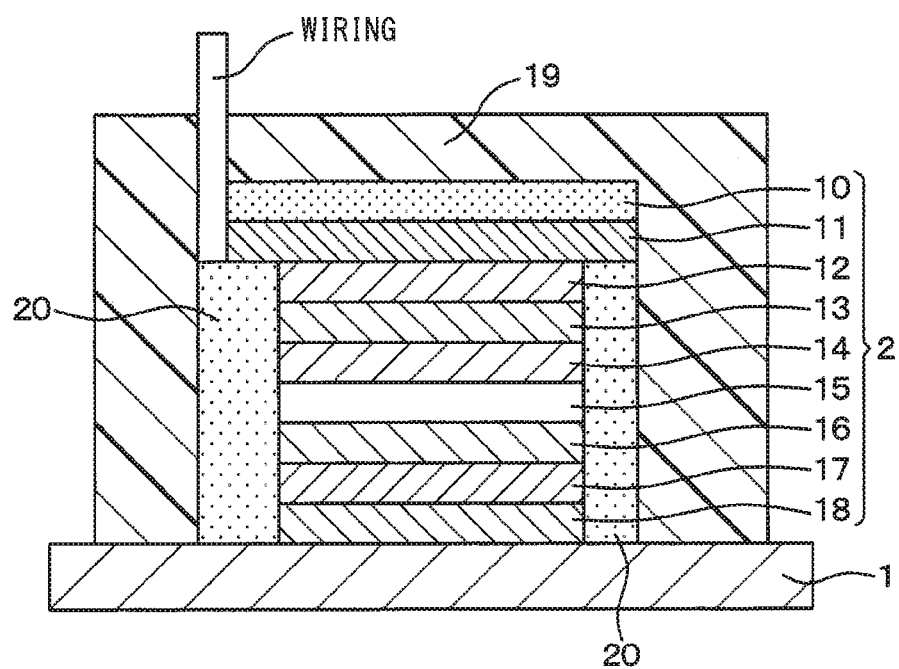
FIG. 5 is a cross-sectional view illustrating an antenna device, or a high-frequency transmitter, according to a variation example of the first embodiment.

In this case, after forming the various layers that configure each magnetic oscillation element on the substrate 10, an Insulating film 20 is formed on the lower electrode 11 so as to surround the base layer 12, antiferromagnetic layer 13, PIN layer 14, intermediate layer 15, free layer 16, cap layer 17, and upper electrode 18 in the in-plane directions, as illustrated in FIG. 5. Similarly to the present embodiment, the antenna 1 is connected to the magnetic oscillation element with insulating resin 19, and then a hole is drilled through the substrate 10 to reach the lower electrode 11 for electrical connection, and a wire is passed through the hole. The magnetic oscillation element and antenna 1 can thus be united also in a variation example in which the substrate 10 is made of an insulating material such as $SiO_2$. Similar effects described above are achieved by this variation example, too.

(Second Embodiment)

The antenna device or high-frequency transmitter according to a second embodiment of the present disclosure will be described with reference to FIG. 6. The configuration of the antenna 1 and magnetic oscillation element unit 2 (or the configuration of the antenna 1 and magnetic oscillation element) of the present embodiment is changed from that of the first embodiment. Other features are the same as those of the first embodiment and will not be described here again.

Figure 6:
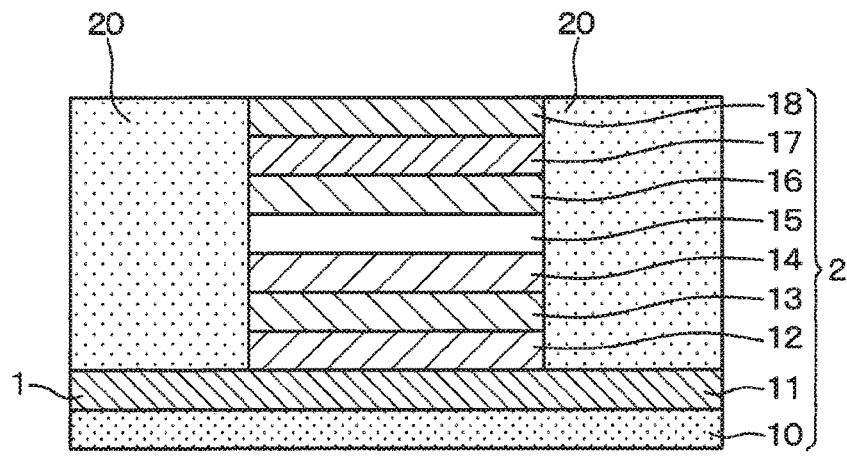
FIG. 6 is a cross-sectional view illustrating an antenna device, or a high-frequency transmitter, according to a second embodiment.

While the basic configuration of the present embodiment is similar to that of the first embodiment, the antenna 1 and the magnetic oscillation element in the magnetic oscillation element unit 2 are configured as illustrated in FIG. 6.

In other words, the layer that forms the lower electrode 11 on the substrate 10 serves also as the antenna 1, i.e., the lower electrode 11 configures the antenna 1. An insulating film 20 is formed on the lower electrode 11 in positions surrounding the base layer 12, antiferromagnetic layer 13, PIN layer 14, intermediate layer 15, free layer 16, cap layer 17, and upper electrode 18 in the in-plane direction. In the present embodiment, the magnetic oscillation element and the antenna 1 are united by such a configuration.

In the present embodiment, the substrate 10 is made of an insulating material, and the antenna 1, lower electrode 11, and upper electrode 18 serve also as wiring that connects the antenna 1 and magnetic oscillation element to the modulator circuit 6 (or wiring that connects the high-frequency transmitter to the power supply 3). Such antennas 1 and magnetic oscillation elements can be fabricated by forming the films that configure the magnetic oscillation elements on the antenna substrate, and patterning the films into the shapes of magnetic oscillation elements.

Similar effects as those of the first embodiment can be achieved by the antenna device or high-frequency transmitter of the present embodiment. By configuring the antenna 1 with the lower electrode 11, no gap will be formed between the oscillation unit and the antenna 1, so that the overall system efficiency can be further improved.

While the substrate 10 is made of an insulating material in the present embodiment, the substrate 10 may be made of a conductive material.

Figure 7:
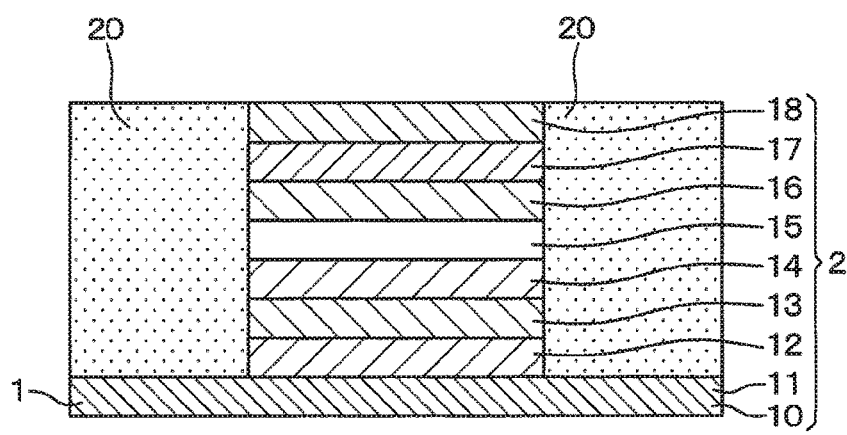
FIG. 7 is a cross-sectional view illustrating a variation example of the antenna device, or the high-frequency transmitter, according to the second embodiment.

A variation example in which the substrate 10 is made of a conductive material is illustrated in FIG. 7. In this variation example, the substrate 10, lower electrode 11, and antenna 1 are configured by one layer, and the base layer 12, antiferromagnetic layer 13, PIN layer 14, intermediate layer 15, free layer 16, cap layer 17, and upper electrode 18 formed on the one layer are surrounded by the insulating film 20 in the in-plane direction similarly to the present embodiment. In this variation example, too, the antenna 1, substrate 10, lower electrode 11, and upper electrode 18 serve as wiring that connects the antenna 1 and magnetic oscillation element to the modulator circuit 6 (or wiring that connects the high-frequency transmitter to the power supply 3). Similar effects described above are achieved by this variation example, too. Since no substrate is present in the direction in which high-frequency electromagnetic waves are transmitted in this variation example, it is considered that the transmission efficiency of high-frequency electromagnetic waves will be higher.

While a Ta layer (not illustrated), lower electrode 11, and base layer 12 are stacked on the substrate 10 in order so as to improve the orientability of the layers from the antiferromagnetic layer 13 onward in the first embodiment, the base layer 12 may be formed on the layer that configures the substrate 10 as in this variation example.

(Third Embodiment)

The antenna device or high-frequency transmitter according to a third embodiment of the present disclosure will be described with reference to FIG. 8. The configuration of the antenna 1 and magnetic oscillation element unit 2 (or the configuration of the antenna 1 and magnetic oscillation element) of the present embodiment is changed from that of the first embodiment. Other features are the same as those of the first embodiment and will not be described here again.

Figure 8:
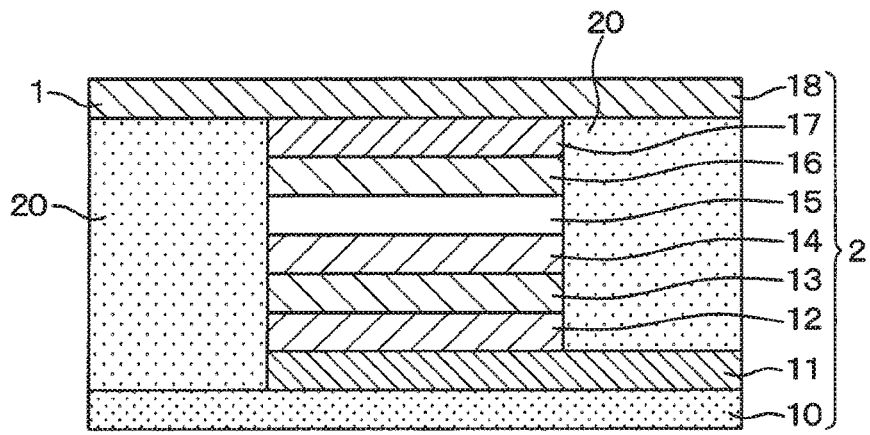
FIG. 8 is a cross-sectional view illustrating an antenna device, or a high-frequency transmitter, according to a third embodiment.

While the basic configuration of the present embodiment is similar to that of the first embodiment, the antenna 1 and the magnetic oscillation element are configured as illustrated in FIG. 8.

In other words, the lower electrode 11, base layer 12, antiferromagnetic layer 13, PIN layer 14, intermediate layer 15, free layer 16, and cap layer 17 are formed on the substrate 10, and an Insulating film 20 is formed on the substrate 10 in positions surrounding the films from the lower electrode 11 to cap layer 17 on the substrate 10 in the in-plane direction. A part of the lower electrode 11 extends through the Insulating film 20 and connects to an external element.

The upper electrode 18 is formed on the cap layer 17 and the insulating film 20 surrounding the cap layer 17. The thin film that forms the upper electrode 18 serves also as the antenna 1, i.e., the upper electrode 18 forms the antenna 1. In the present embodiment, the magnetic oscillation element and the antenna 1 are united by such a configuration.

In the present embodiment, the substrate 10 is made of an insulating material, and the antenna 1, lower electrode 11, and upper electrode 18 serve also as wiring that connects the antenna 1 and magnetic oscillation element to the modulator circuit 6 (or wiring that connects the high-frequency transmitter to the power supply 3). Such antennas 1 and magnetic oscillation elements can be produced by forming the films that will constitute the magnetic oscillation elements on the substrate 10, patterning the films into the shapes of the magnetic oscillation elements, forming the upper electrode 18 thereafter, and patterning the upper electrode 18 into the shapes of the antennas.

Similar effects as those of the first and second embodiments can be achieved by the antenna device or high-frequency transmitter of the present embodiment. Since no substrate is present in the direction in which high-frequency electromagnetic waves are transmitted in the present embodiment, it is considered that the transmission efficiency of high-frequency electromagnetic waves will be higher. Moreover, since the antennas 1 are configured by the upper electrode 18 in the present embodiment, the antenna device can be produced easily compared to the case of processing the substrate 10 into the shapes of the antennas.

While the substrate 10 is made of an insulating material in the present embodiment, the substrate 10 may be made of a conductive material. In this case, the substrate 10 serves also as wiring that connects the antenna 1 and magnetic oscillation element to the modulator circuit 6 (or wiring that connects the high-frequency transmitter to the power supply 3), in addition to the antenna 1, lower electrode 11, and upper electrode 18.

(Fourth Embodiment)

Figure 9A:
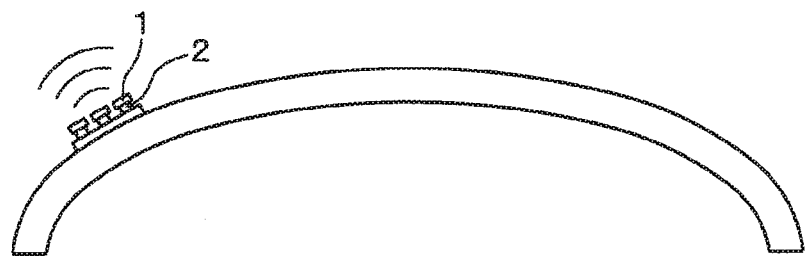
FIG. 9A illustrates an arrangement of an antenna device, or a high-frequency transmitter, according to a fourth embodiment.

The antenna device or high-frequency transmitter according to a fourth embodiment of the present disclosure will be described with reference to FIG. 9A and FIG. 9B. In the present embodiment, the antennas 1 and magnetic oscillation element units 2 that configure the antenna device of the first embodiment (or the high-frequency transmitter of the first embodiment) are disposed as will be described below. Other features are the same as those of the first embodiment and will not be described here again.

The magnetic oscillation elements are thinner and have a smaller area than common antenna devices. The thickness is several tens nm to several hundreds nm, and the area is several $nm^2$ to several $\mu m^2$, for example. It is therefore possible to dispose the antennas 1 and magnetic oscillation element units 2 of the first embodiment on a curved surface such as the bumper or front glass of a car, or on a parabola antenna.

Common antenna devices, when disposed on a car bumper, for example, need to be arranged inside the bumper because of their size, and here, electromagnetic wave reflection on the bumper surface is an issue. In contrast, since the magnetic oscillation elements are thin and occupy a small area, the antennas 1 and magnetic oscillation element units 2 of the first embodiment can be disposed outside the bumper as illustrated in FIG. 9A, so that the issue of electromagnetic wave reflection on the bumper surface can be avoided.

Also, if the antennas 1 and magnetic oscillation element units 2 of the first embodiment are disposed on a deformable component such as an organic EL (electroluminescence) element and this element is deformed during use, there are less worries of malfunction since the magnetic oscillation elements are thin and occupy a small area. Since the antennas 1 and magnetic oscillation element units 2 of the first embodiment can be disposed on a deformable component during production also facilitate processing, a method of deforming the component having the antennas 1 and magnetic oscillation element units 2 of the first embodiment disposed, which facilitates the processing of the component.

Figure 9B:
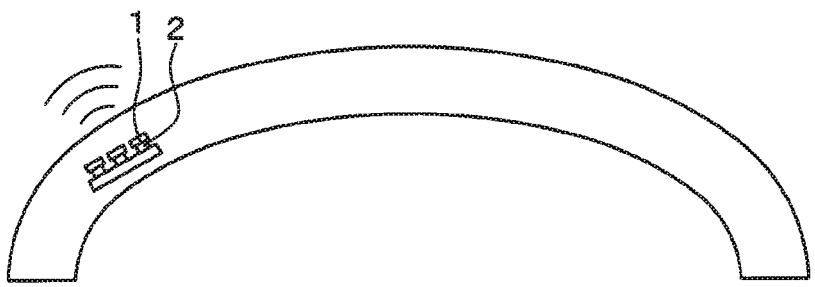
FIG. 9B illustrates the arrangement of the antenna device, or the high-frequency transmitter, according to the fourth embodiment.

The antennas 1 and magnetic oscillation element units 2 of the first embodiment (or the high-frequency transmitter of the first embodiment) can also be disposed inside such a component as illustrated in FIG. 9B. The magnetic oscillation elements have excellent shock resistance because no quartz is used. By being disposed inside a component, the antennas 1 and magnetic oscillation element units 2 of the first embodiment (or the high-frequency transmitter of the first embodiment) can have even better shock resistance and also higher environment resistance against environmental external disturbances other than shocks. Such an embodiment is suited in applications subjected to environmental external disturbances such as shocks and weathers, such as on car bumpers, for example.

While the antennas 1 and magnetic oscillation element units 2 of the first embodiment (or the high-frequency transmitter of the first embodiment) are disposed as described above in the present embodiment, the antennas 1 and magnetic oscillation element units 2 of the second or third embodiment (or the high-frequency transmitter of the second or third embodiment) may be disposed as described above. Similar effects described above are achieved in this case, too.

(Fifth Embodiment)

The antenna device or high-frequency transmitter according to a fifth embodiment of the present disclosure will be described with reference to FIG. 10. In the present embodiment, the antennas 1 and magnetic oscillation element units 2 that configure the antenna device of the first embodiment (or the high-frequency transmitter of the first embodiment) are disposed as will be described below. Other features are the same as those of the first embodiment and will not be described here again.

Figure 10:
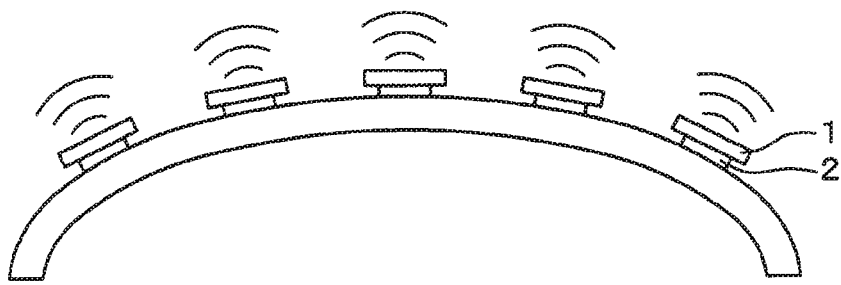
FIG. 10 illustrates an arrangement of an antenna device, or a high-frequency transmitter, according to a fifth embodiment.

As illustrated in FIG. 10, the plurality of antennas 1 and magnetic oscillation element units 2 that configure the antenna device of the first embodiment (or the high-frequency transmitter of the first embodiment) may be disposed on a curved surface so as to transmit electromagnetic waves to an arbitrary direction, as with a phased-array antenna. More specifically, the plurality of antennas 1 are oriented in different directions so that one of the antennas 1 and magnetic oscillation element units 2 which transmit an electromagnetic wave is selected by a circuit (not illustrated) to transmit electromagnetic waves to an arbitrary direction.

Alternatively, no such circuit for selecting an antenna 1 and magnetic oscillation element unit 2 to transmit an electromagnetic wave may be provided, and all the antennas 1 may transmit electromagnetic waves.

In the present embodiment, it is not necessary to change the phase of the high-frequency power generated by the magnetic oscillation element of each magnetic oscillation element unit 2 and to control the direction of the electromagnetic waves transmitted from the entire antenna device, so that the antenna device may not include the modulator circuit 6.

While the plurality of antennas 1 and magnetic oscillation element units 2 that configure the antenna device of the first embodiment (or the high-frequency transmitter of the first embodiment) are disposed on a curved surface in the present embodiment, the antennas 1 and magnetic oscillation element units 2 may be disposed as illustrated in FIG. 11A to FIG. 11D. Variation examples of the present embodiment will be described below.

Figure 11A:
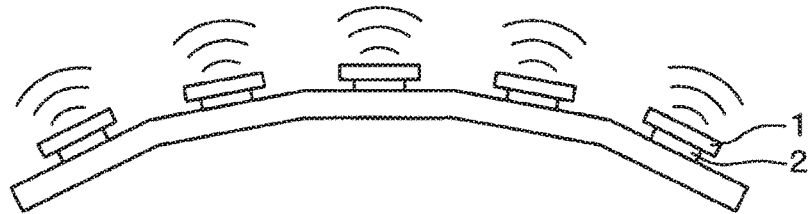
FIG. 11A illustrates the arrangement of a variation example of the antenna device, or the high-frequency transmitter, according to the fifth embodiment.
Figure 11B:
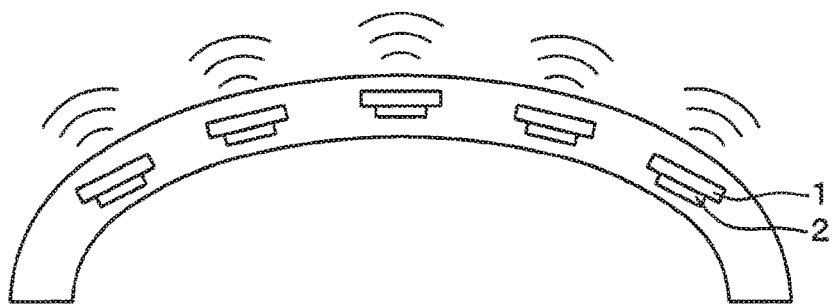
FIG. 11B illustrates the arrangement of a variation example of the antenna device, or the high-frequency transmitter, according to the fifth embodiment.
Figure 11C:
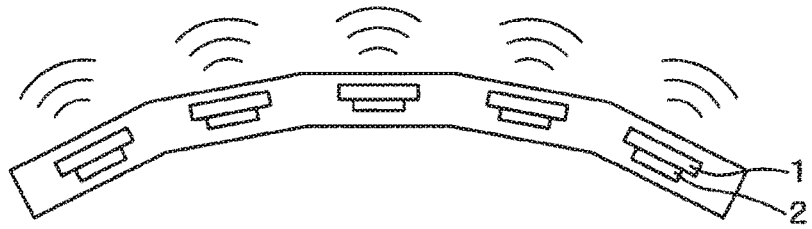
FIG. 11C illustrates the arrangement of a variation example of the antenna device, or the high-frequency transmitter, according to the fifth embodiment.

As illustrated in FIG. 11A, the plurality of antennas 1 and magnetic oscillation element units 2 that configure the antenna device of the first embodiment may be disposed on each side of a polygonal shape of a member that has a polygonal cross section, so as to likewise transmit electromagnetic waves to an arbitrary direction. As illustrated in FIG. 11B and FIG. 11C, the antennas 1 and magnetic oscillation element units 2 that configure the antenna device of the first embodiment (or the high-frequency transmitter of the first embodiment) may also be disposed inside such a member.

Figure 11D:
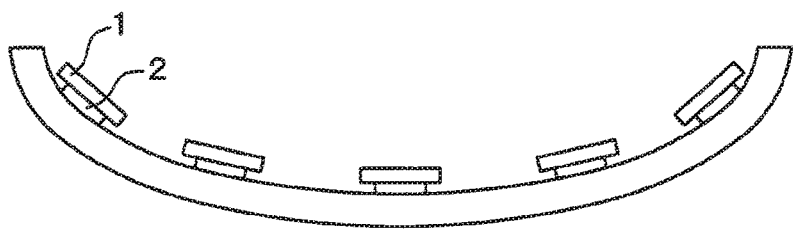
FIG. 11D illustrates the arrangement of a variation example of the antenna device, or the high-frequency transmitter, according to the fifth embodiment.

In a variation example illustrated in FIG. 11D, the plurality of antennas 1 and magnetic oscillation element units 2 that configure the antenna device of the first embodiment (or the high-frequency transmitter of the first embodiment) are disposed on a parabolic surface, which is, specifically, formed by rotating a parabolic curve about a symmetrical axis. This way, the antenna device can have characteristics of a parabola antenna.

While the antennas 1 and magnetic oscillation element units 2 of the first embodiment (or the high-frequency transmitter of the first embodiment) are disposed as described above in the present embodiment, the antennas 1 and magnetic oscillation element units 2 of the second or third embodiment (or the high-frequency transmitter of the second or third embodiment) may be disposed as described above. Similar effects described above are achieved in this case, too.

(Sixth Embodiment)

The antenna device according to a sixth embodiment of the present disclosure will be described with reference to FIG. 12. The shape of the antenna 1 and substrate 10 of the present embodiment is changed from that of the first embodiment. Other features are the same as those of the first embodiment and will not be described here again.

Figure 12:
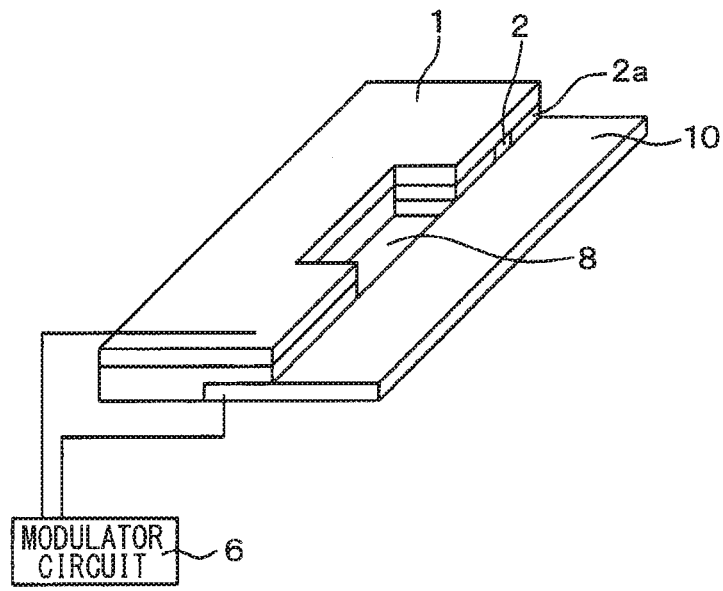
FIG. 12 is a perspective view illustrating an antenna device according to a sixth embodiment.

While the present embodiment is similar to the first embodiment in the basic configuration, the current path includes a portion that surrounds a hole 8 having a linear shape in the electrical circuit configured by the antenna 1 and magnetic oscillation element unit 2 as illustrated in FIG. 12 so that a slit antenna is formed. The hole 8 is formed for each magnetic oscillation element unit 2 here.

More specifically, the antenna 1 and the substrate 10 of the magnetic oscillation element in the magnetic oscillation element unit 2 are formed in a U-shape, and with the antenna 1 and substrate 10 facing each other, both ends of the U-shape are stacked up in the thickness direction, so as to form the hole 8 having a linear shape. An insulating layer 2a made of Al—$O_x$, MgO, $SiO_2$ and the like is formed in a portion where the magnetic oscillation element unit 2 is not formed between the antenna 1 and the substrate 10. The wire that connects the modulator circuit 6 with the antenna device is connected to a portion where the antenna 1 and substrate 10 overlap in the thickness direction on the side where no magnetic oscillation element unit 2 is formed.

Similar effects as those of the first embodiment can be achieved by the antenna device of the present embodiment. While the high-frequency electromagnetic waves transmitted from the magnetic oscillation elements in the magnetic oscillation element units 2 are circularly polarized, the high-frequency electromagnetic waves can be converted to linearly polarized high-frequency electromagnetic waves in the present embodiment because a slit antenna is formed by the antenna 1 and magnetic oscillation element unit 2. Therefore, the antenna device of the present embodiment can effectively achieve the directivity of a phased-array antenna.

While the shape of the antenna 1 of the present embodiment is changed from that of the first embodiment, the shape of the antenna 1 may be changed from those of the second to fourth embodiments. Similar effects described above are achieved in this case, too.

While the antenna device of the fifth embodiment is not a phased-array antenna, the shape of the antenna 1 may be changed from that of the fifth embodiment.

While the hole 8 is formed for each magnetic oscillation element unit 2 in the present embodiment, the hole 8 may be formed for each magnetic oscillation element in the magnetic oscillation element unit 2.

Figure 13:
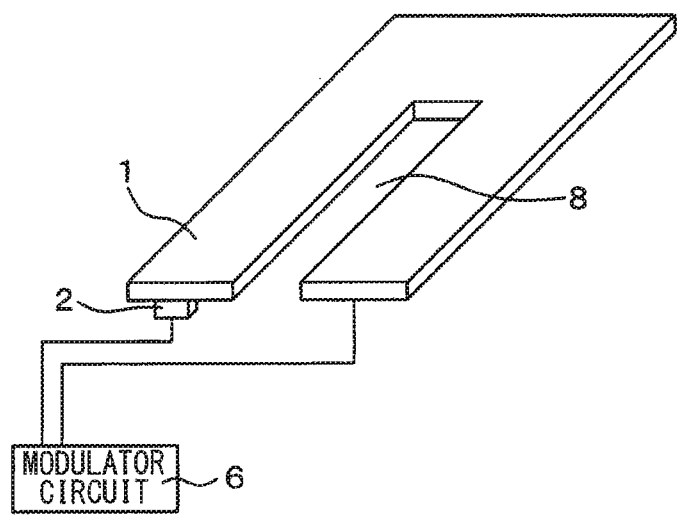
FIG. 13 is a perspective view illustrating a variation example of the antenna device according to the sixth embodiment.

With the configuration, the current supplied from the modulator circuit 6 flows all around the hole 8 having a linear shape and returns to the modulator circuit 6 in the present embodiment, and the current may be made to flow half around the hole 8 having a linear shape and return to the modulator circuit 6. For example, as illustrated in FIG. 13, the antenna 1 alone may be formed in a U-shape while the magnetic oscillation element unit 2 is formed on one end of the antenna 1, and the wire that connects the modulator circuit 6 and the antenna device may be connected to the magnetic oscillation element unit 2 and to the other end of the antenna 1.

(Other Embodiments)

The present disclosure is not limited to the embodiments described above and changes can be made as required within the scope as set forth in the claims.

For example, while the antennas 1 and magnetic oscillation element units 2 are disposed on the surface of or inside a curved component in the fourth and fifth embodiments described above, they may be disposed on the surface of or inside a flat plate-like or block-like component.

While the controller 5 controls the power supply 3 in the first embodiment described above, a voltage controller including a controllable resistance, capacitor and the like may be connected between the power supply 3 and the modulator circuit 6, and, with the controller 5 connected to the voltage controller, the current flowing through the antennas 1 and others may be controlled.

The layers between the lower electrode 11 and the upper electrode 18 may be formed in the reverse order from that of the first to third embodiments described above.

Optionally, the magnetization direction of the PIN layer 14 may be fixed by the material or processing method of the PIN layer 14, for example, without using the antiferromagnetic layer 13. Alternatively, the magnetization direction of the PIN layer 14 may be fixed by using a hard magnetic layer made of a hard magnetic material instead of the antiferromagnetic layer 13.

A magnetic layer made of NiFe or the like need not be formed between the base layer 12 and the antiferromagnetic layer 13.

The magnetic oscillation element need not include a synthetic ferrimagnetic layer.

The magnetization directions of the PIN layer 14 and free layer 16 may be differed from that of the first embodiment described above. The direction in which the direct current I flows may be reversed from that of the first embodiment described above. Note that the magnitude of spin transfer torque that causes the high-frequency oscillation in the magnetic oscillation element is determined by the relative angle θ between the magnetization directions of the PIN layer 14 and free layer 16. More precisely, the magnitude of spin transfer torque is proportional to sin θ, and is maximum when θ is 90°. Therefore, it is desirable that the magnetization direction of the PIN layer 14 and the magnetization direction of the free layer 16 be perpendicular to each other as in the first embodiment described above.

Optionally, the magnetic oscillation elements provided in the magnetic oscillation element units 2 may be of a sombrero-shaped nano-contact type.

Figure 14:
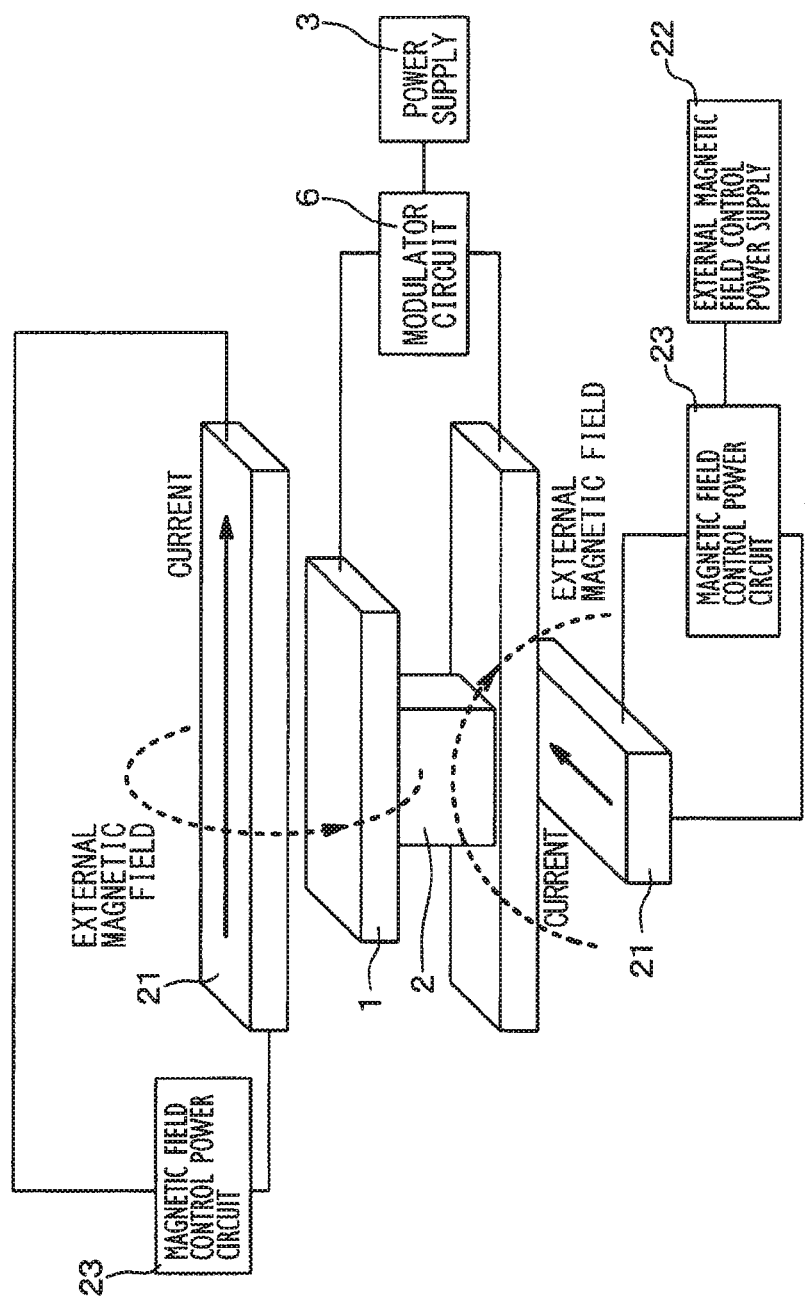
FIG. 14 is an overall configuration diagram illustrating a transmitter system according to another embodiment.

While coils are used as the external magnetic field generator 21 in the embodiments described above, the wiring configuration illustrated in FIG. 14 may be used instead of the coils. The wires that configure the external magnetic field generator 21 here run parallel to the film plane of the magnetic oscillation elements in the magnetic oscillation element units 2 and are placed in directions perpendicular to each other.

While the method of using coils is useful when the magnetic oscillation element units 2 and the external magnetic field generator 21 are disposed separately, the magnitude and direction of external magnetic fields applied to the magnetic oscillation elements in the magnetic oscillation element units 2 vary depending on the positions of the coils and the magnetic oscillation elements. When coils are to be disposed on one or both outer sides in the direction perpendicular to the film planes of the magnetic oscillation elements, the number of layers formed of the magnetic oscillation element units 2 and coils will increase in antenna devices including a plurality of magnetic oscillation element units 2 as in the first to sixth embodiments described above.

In contrast, in the configuration illustrated in FIG. 14, two wires perpendicular to each other are provided near each magnetic oscillation element unit 2, and a current is conducted from the magnetic field control power circuit 23 to these two wires. The magnetic fields that are applied to each magnetic oscillation element unit 2 will then be a combination of magnetic fields generated by the current flowing through the two wires. Thus the magnitude and direction of the magnetic field applied to each magnetic oscillation element unit 2 can be adjusted by adjusting the magnitude and direction of the current flowing through each wire. Also, it is possible to apply an external magnetic field in either of an in-plane direction of the film and a direction perpendicular to the film plane by adjusting the positions of the wires. This way, in the configuration illustrated in FIG. 14, external magnetic fields can be applied as desired to any of the magnetic oscillation element units 2 even if one module includes a plurality of magnetic oscillation element units 2.

Figure 15:
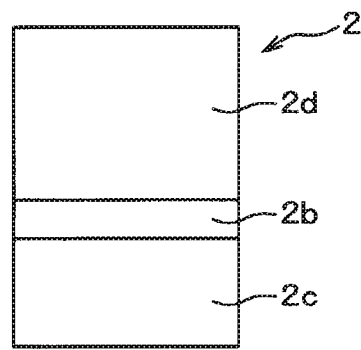
FIG. 15 is a cross-sectional view illustrating a magnetic oscillation element and an external magnetic field application unit in another embodiment.

Alternatively, as illustrated in FIG. 15, a spacer layer 2b and an external magnetic field generating the external magnetic field generating magnetic layer 2c may be stacked on one end in the direction perpendicular to the film plane of the magnetic oscillation element provided in the magnetic oscillation element unit 2. FIG. 15 shows a configuration where the spacer layer 2b and the external magnetic field generating magnetic layer 2c are stacked on one end in the direction perpendicular to the film plane of one magnetic oscillation element (denoted by 2d in the drawing) provided in the magnetic oscillation element unit 2.

The spacer layer 2b is a layer for cutting the magnetic coupling between the external magnetic field generating magnetic layer 2c and the PIN layer 14 and free layer 16, and is made of Ta, W, Ti, Ru and the like. The spacer layer 2b may be used in some cases as the layer for enhancing the magnetic coupling with the PIN layer 14 and free layer 16 with the use of magnetic anisotropy of the external magnetic field generating magnetic layer 2c.

The external magnetic field generating magnetic layer 2c is provided for generating an external magnetic field in the direction perpendicular to the film plane, more precisely, a leaking magnetic field, and applying the magnetic field to the magnetic oscillation elements. Alternatively, an external magnetic field may be applied to the magnetic oscillation elements in the in-plane direction with the use of a leaking magnetic field generated from the PIN layer 14, or a leaking magnetic field generated when the external magnetic field generating magnetic layer 2c is magnetized in the in-plane direction of the magnetic oscillation elements. The external magnetic field generating magnetic layer 2c is preferably a perpendicular magnetization film layer made of Co, Fe, Ni, Pt, Pd, and the like. Alternatively, the perpendicular magnetization film may be made of GaMn or CoFeB/MgO. The external magnetic field generating magnetic layer 2c does not provide the MR effect in the operation of the antenna device described in the first embodiment.

By configuring the external magnetic field generating magnetic layer 2c with a multilayer film, the magnetic anisotropy and the magnitude of the generated leaking magnetic field can be controlled easily by changing the number of layers or thickness of the film. The external magnetic field generating magnetic layer 2c may be disposed separately from the magnetic oscillation elements, but can be easily processed when produced simultaneously with the magnetic oscillation elements and can apply a larger external magnetic field.

If the external magnetic field generating magnetic layer 2c is to be configured by a multilayer film of Co/Pt, Co/Pd, and the like, it generally needs to be subjected to a heat treatment at about 300° C. to 400° C. after the film formation. If the external magnetic field generating magnetic layer 2c is to be configured by an alloy such as L10-PtFe instead of a multilayer film, the substrate needs to be heated at about 600° C. during the film formation.

Figure 16:
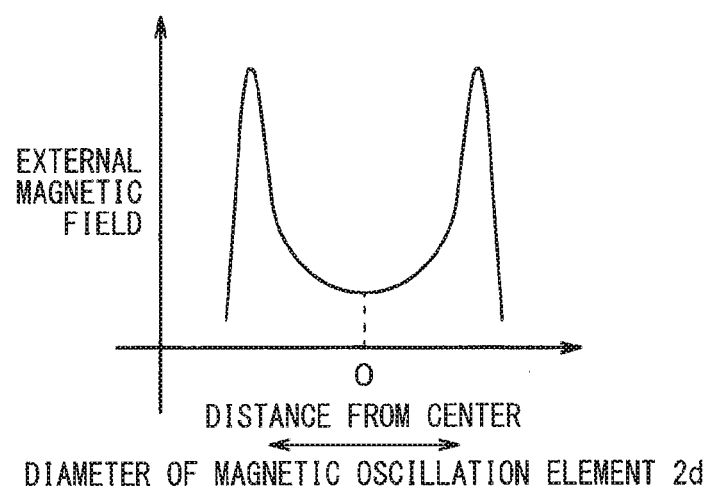
FIG. 16 is a graph illustrating the position dependency of external magnetic fields in another embodiment.

As illustrated in FIG. 16, the leaking magnetic field from the external magnetic field generating magnetic layer 2c has dependency on in-plane positions. However, such dependency on in-plane positions is reduced as illustrated in FIG. 18 by making the width in the in-plane direction of the magnetic oscillation element 2d smaller than the widths of the external magnetic field generating magnetic layer 2c and spacer layer 2b as illustrated in FIG. 17, so that controllability is increased.

Figure 17:
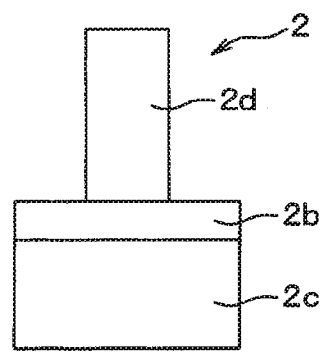
FIG. 17 is a cross-sectional view illustrating a magnetic oscillation element and an external magnetic field application unit in another embodiment.
Figure 18:
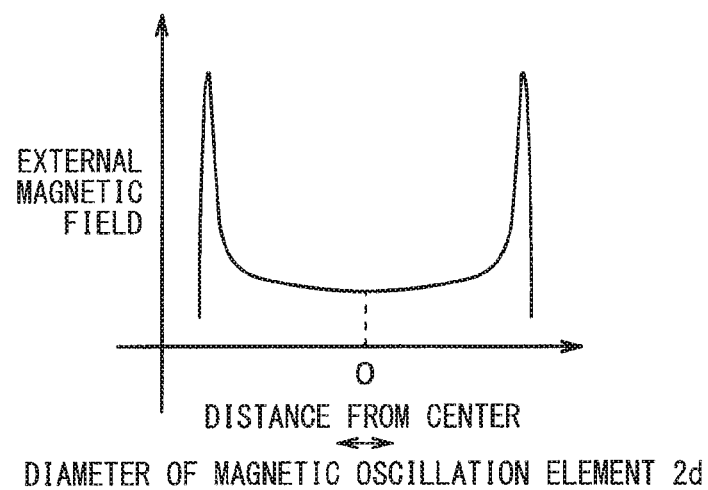
FIG. 18 is a graph illustrating the position dependency of external magnetic fields in another embodiment.

While an external magnetic field that can be applied with the configuration illustrated in FIG. 14 is as small as several tens mT at most, a larger external magnetic field can be applied with the configurations illustrated in FIG. 15 and FIG. 17. The configurations illustrated in FIG. 15 and FIG. 17 however can apply an external magnetic field in only one direction, and therefore it is preferable to combine the configuration illustrated in FIG. 14 with the configurations illustrated in FIG. 15 and FIG. 17.

Optionally, a field effect element may be used as the external magnetic field generator 21. A field effect element has a structure of an antiferromagnetic layer/magnetic layer/insulating layer and is capable of modulating the magnetic anisotropy of a magnetic layer with an applied voltage, i.e., electric field. In other words, the magnetic field generated by the field effect element can be modulated by changing the applied voltage to the field effect element. With a field effect element used as the external magnetic field generator 21, an external magnetic field can be applied as desired to minute magnetic oscillation elements by changing the voltage applied from the external magnetic field control power supply 22 to the external magnetic field generator 21.

The non-magnetic layer that configures the field effect element is made of Au, Pt, Pd, Ta, Ru, for example, either alone or a compound of these elements. The non-magnetic layer may also be configured by a film of a plurality of layers of these elements or compounds thereof.

The magnetic layer that configures the field effect element is, for example, made of a magnetic body alone such as Fe, Co, and Ni, or a compound of these elements and a non-magnetic body such as Pt, Pd, and B.

The insulating film that configures the field effect element is made of MgO, $HfO_2$, Al—$O_x$, Zn—$O_x$, polymide, propylene carbonate, and the like, for example.

In general, magnetic anisotropy of a field effect element that uses a metal magnetic body is predominantly the Interfacial magnetic anisotropy of the metal magnetic layer and insulating layer. This interfacial magnetic anisotropy can be modulated with an electric field.

While two coils are disposed in each magnetic oscillation element unit 2 in the first embodiment described above, two coils may be disposed for each of the magnetic oscillation elements provided in the magnetic oscillation element unit 2. Similarly, two wires may be provided near each of the magnetic oscillation elements in the configuration illustrated in FIG. 14 for conducting a current from the magnetic field control power circuit 23.

While the plurality of antennas 1 are arranged in grids in the first embodiment described above, the plurality of antennas 1 may be placed in other positions. Some of the antennas 1 only may be arranged in grids. Also, while the plurality of antennas 1 are oriented in the same direction in the first embodiment described above, at least two antennas 1 may be oriented in the same direction.

In the sixth embodiment, while the hole 8 is formed for each magnetic oscillation element unit 2, the holes 8 may be formed only for some magnetic oscillation element units 2. The magnetic oscillation elements provided in the magnetic oscillation element unit 2 may not be united with the antenna 1. In this case, the wiring for connecting the antenna 1 and the magnetic oscillation element unit 2 and the wiring for connecting the antenna 1 and the modulator circuit 6 may be formed on both short sides of the hole 8.

While the magnetic oscillation element unit 2 includes the plurality of magnetic oscillation elements in the first embodiment described above, the magnetic oscillation element unit 2 may include only one magnetic oscillation element.

While the present disclosure has been described with reference to embodiments thereof, it is to be understood that the disclosure is not limited to the embodiments and constructions. The present disclosure is intended to cover various modification and equivalent arrangements. In addition, while the various combinations and configurations, other combinations and configurations, including more, less or only a single element, are also within the spirit and scope of the present disclosure.

The invention claimed is:

1. A high-frequency transmitter comprising:
   a converter that converts electrical energy to high-frequency power; and
   a transmitter unit that transmits the high-frequency power converted by the converter to open space outside the converter as an electromagnetic wave, wherein:
   the converter includes a magnetic oscillation element having a function of modulating the high-frequency power in accordance with the electrical energy;
   the magnetic oscillation element includes a pair of electrodes in a thin-film form, and further includes, between the pair of electrodes,
   a PIN layer having a fixed magnetization direction,
   a free layer having a magnetization direction varied in accordance with an external magnetic field, and
   an intermediate layer arranged between the PIN layer and the free layer;
   a resistance value of an element, which is configured by the PIN layer, the intermediate layer, and the free layer, changes depending on an angle between a magnetization direction of the PIN layer and a magnetization direction of the free layer; and
   the transmitter unit is configured integrally with the magnetic oscillation element, wherein
   the PIN layer includes a p-type layer, an intrinsic layer and an n-type layer, which are stacked in order.

2. The high-frequency transmitter according to claim 1, wherein:
   the transmitter unit is configured by a separate component different from the magnetic oscillation element; and
   one of two electrodes, which configure the pair of electrodes, is connected to the transmitter unit.

3. The high-frequency transmitter according to claim 1, wherein the transmitter unit is configured by one of two electrodes, which configure the pair of electrodes.

4. The high-frequency transmitter according to claim 1, wherein:
   the magnetic oscillation element is arranged on a substrate; and
   one of two electrodes, which configure the pair of electrodes, is configured by the substrate.

* * * * *